US006776806B2

(12) United States Patent
Gudesen et al.

(10) Patent No.: US 6,776,806 B2
(45) Date of Patent: Aug. 17, 2004

(54) METHOD FOR GENERATING ELECTRICALLY CONDUCTING AND/OR SEMICONDUCTING STRUCTURES IN TWO OR THREE DIMENSIONS, A METHOD FOR ERASING THE SAME STRUCTURES AND AN ELECTRIC FIELD GENERATOR/MODULATOR FOR USE WITH THE METHOD FOR GENERATING

(75) Inventors: Hans Gude Gudesen, Brussels (BE); Per-Erik Nordal, Asker (NO); Geirr I. Leistad, Sandvika (NO)

(73) Assignee: Thin Film Electronics ASA, Oslo (NO)

( * ) Notice: Subject to any disclaimer, the term of this patent is extended or adjusted under 35 U.S.C. 154(b) by 266 days.

(21) Appl. No.: 09/978,043

(22) Filed: Oct. 17, 2001

(65) Prior Publication Data

US 2003/0085439 A1 May 8, 2003

Related U.S. Application Data

(62) Division of application No. 09/381,994, filed as application No. PCT/NO99/00022 on Jan. 28, 1999, now Pat. No. 6,432,739.

(30) Foreign Application Priority Data

Jan. 28, 1998 (NO) .............................................. 980385
Feb. 6, 1998 (NO) .............................................. 982518

(51) Int. Cl.[7] ..................... H01L 21/306; H01L 21/268; H01L 51/40
(52) U.S. Cl. ........................ 29/25.01; 438/99; 438/795; 438/799
(58) Field of Search ......................... 29/25.01; 438/99, 438/795–799, 776; 257/40, 421, 422, 424; 361/805; 365/105, 145, 175

(56) References Cited

U.S. PATENT DOCUMENTS

| 4,371,883 A | 2/1983 | Potember et al. |
| 4,806,995 A | 2/1989 | Day et al. |

(List continued on next page.)

FOREIGN PATENT DOCUMENTS

| EP | 0344346 | 12/1989 |
| WO | 95 09438 | 4/1995 |

OTHER PUBLICATIONS

A.R. Brown et al., "Logic Gates Made From Ploymer Transistors and Their Use in Ring Oscillators", *Science*, vol. 270, Nov. 10, 1995.
Francis Garnier et al., "All–Polymer Field–Effect Transistor Realized by Printing Techniques", *Science*, vol. 265, Sep. 16, 1994.
D.M. deLeeuw et al., "Polymeric Integrated Circuits and Light–Emitting Diodes", *IEEE*, (1997).
Yen–Yi Lin et al., "Pentacene–Based Organic Thin–film Transistors", *IEEE Transactions on Electron Devices*, vol. 44, No. 8, 8/97.

*Primary Examiner*—Nathan J. Flynn
*Assistant Examiner*—Johannes Mondt
(74) *Attorney, Agent, or Firm*—Birch, Stewart, Kolasch & Birch, LLP

(57) ABSTRACT

A method for generating electrically conducting and/or semiconducting structures in three dimensions in a matrix that includes two or more materials in spatially separated material structures is disclosed. An electric field is applied to the separate material structure and the field is modulated spatially according to a protocol. The protocol represents a predetermined pattern of electrically conducting and/or semiconducting structures that are generated in the material structure in response to the field. The matrix composed by the material structures includes structures of this kind in three dimensions.

13 Claims, 10 Drawing Sheets

U.S. PATENT DOCUMENTS

| | | | |
|---|---|---|---|
| 4,825,408 A | | 4/1989 | Potember et al. |
| 5,043,251 A | | 8/1991 | Sonnenschein et al. |
| 5,378,916 A | | 1/1995 | Mantell |
| 5,537,108 A | * | 7/1996 | Nathan et al. ............... 257/529 |
| 5,572,409 A | * | 11/1996 | Nathan et al. ............... 361/806 |
| 5,656,548 A | * | 8/1997 | Zavracky et al. ............. 438/23 |
| 5,677,041 A | | 10/1997 | Smayling |
| 5,686,341 A | | 11/1997 | Roesner |
| 5,703,394 A | * | 12/1997 | Wei et al. .................... 257/433 |
| 5,808,351 A | | 9/1998 | Nathan et al. |
| 6,429,450 B1 | * | 8/2002 | Mutsaers et al. ............. 257/40 |

* cited by examiner

LEGEND TO FIGS.

ISOLATING

SEMICONDUCTING p-TYPE SEMICONDUCTING n-TYPE SEMICONDUCTING

CONDUCTING, ELECTRODES

HORIZONTAL AND VERTICAL CONDUCTING PATH (△, UP; ▽, DOWN)

US 6,776,806 B2

METHOD FOR GENERATING ELECTRICALLY CONDUCTING AND/OR SEMICONDUCTING STRUCTURES IN TWO OR THREE DIMENSIONS, A METHOD FOR ERASING THE SAME STRUCTURES AND AN ELECTRIC FIELD GENERATOR/MODULATOR FOR USE WITH THE METHOD FOR GENERATING

This application is divisional of application Ser. No. 09/381,994, filed on Sep. 28, 1999 now U.S. Pat. No. 6,432,739 and for which priority is claimed under 35 U.S.C. § 120. application Ser. No. 09/381,994 is the national phase of PCT International Application No. PCT/NO99/00022 filed on Jan. 28, 1999 under 35 U.S.C. § 371. The entire contents of each of the above-identified applications are hereby incorporated by reference. This application also claims priority of Application Nos. 19980385 and 19982518 filed in Norway on Jan. 28, 1998 and Jun. 2, 1998, respectively, under 35 U.S.C. § 119.

A method for generating electrically conducting and/or semiconducting structures in two or three dimensions, a method for erasing the same structures and an electric field generator/modulator for use with the method for generating.

BACKGROUND OF THE INVENTION

The invention concerns a method for generating electrically conducting and/or semiconducting structures in two or three dimensions in a composite matrix. The matrix comprises one or more materials provided in spatially separate and homogenous material structures. The materials can undergo specific physical and/or chemical changes of state in response to the supply of energy, which cause transition from an electrically non-conducting state to an electrically conducting and/or semiconducting state or vice versa, or a change in the electrical conduction mode of the of the material. Each material structure is made in the form of a thin layer.

The invention also concerns a method for globally erasing electrically conducting and/or semiconducting structures generated in two or three dimensions in a composite matrix. The matrix comprises two or more materials provided in spatially separate and homogenous material structures. The materials can undergo specific physical and/or chemical changes of state in response to the supply of energy, which cause transition from an electrically non-conducting state to an electrically conducting and/or semiconducting state or vice versa, or a change in the electrical conduction mode of the of the material. Each material structure is made in the form of a thin layer.

Finally, the invention concerns an electric field generator/modulator (EFGM) for patterning and generating conducting and/or semiconducting structures in two or three dimensions in a composite matrix. The matrix comprises one or more materials provided in one or more spatially separate and homogenous material structures, respectively. The materials can undergo specific and/or chemical changes of state in response to the supply of energy, which cause transition from an electrically non-conducting state to an electrically conducting and/or semiconducting state or vice versa, or a change in the electrical conduction mode of the of the material. Each material structure is made in the form of a thin layer.

More particularly the present invention concerns the fabrication of two- and three-dimensional isolating, resistive, conducting and/or semiconducting patterns and structures for use in electronic circuits which most particularly consist of a single or several stacked layers of thin films.

The evolution of microelectronic technology shows a steady trend towards smaller dimensions and reduced costs of the devices. Well-substantiated predictions show that performance is going to increase, while the price per unit or device will decrease. However, today's microelectronic technology is substantially based on crystalline silicon and shows an increasing tendency towards diminishing returns, mainly due to the inherent limitations associated with the complexity of ultra-high resolution lithography and increasing demands of the material processing. Extrapolations of the present technologies based on crystalline silicon are not expected to offer dramatic breakthroughs in either performance or price. Future improvements shall require manufacturing plants and manufacturing equipment, which are extremely capital-intensive.

On the other hand, microelectronics based on thin-film technology are predicted to deliver products representing real breakthroughs in both performance and price in the near future. The shift from crystalline inorganic semiconductors to microcrystalline, polycrystalline or amorphous inorganic or organic semiconductors will introduce entirely novel boundary conditions with regard to the production of microelectronics Particularly, the blanks can have form factors, which make large areas possible, i.e., the substrates can be large sheets instead of wafers cut from blanks of limited size, and great flexibility with regard to architectures. These are essential factors in the expected development of tomorrow's electronic technology. In the present invention special emphasis will be placed on the use of organic materials due to the ease whereby they can be processed. Additionally, organic materials allow for the use of large areas and multilayer blanks with precisely controllable thickness, and provide vast potential for chemical tailoring of the desired material properties.

Before the use of electronics based on amorphous materials can fulfill their expected potential, further developments in certain areas are required. In recent years an effort has been made to improve the semiconducting properties of organic semiconducting thin-film materials. These improvements have dramatic and rapid increase in transistor performance to a point where organic-based transistors can now compete with transistors based on amorphous silicon (see for instance Y.-Y. Lin, D. J. Gundlach, S. F. Nelson and T. N. Jackson,"Pentacene-Based Organic Thin Film Transistors". IEEE Transactions on Electron Devices, August 1997). Other on-going projects will lead to coating processes for thin film in order to generate organic and amorphous silicon semiconductors at low temperatures with compatibility to a broad range of organic and inorganic substrate materials. This has lead to the development of extremely electronic devices with large areas based on the use of high-volume manufacturing methods.

In spite of this development a wholly satisfactory solution is still lacking for adaptation of the fabrication technology for low-cost flexible high-volume production of electrical connections in the thin-film structures forming the electronic circuits. Currently thin-film devices are based on amorphous silicon manufactured with current paths and conductors patterned with traditional methods such as lithography and vacuum metallization. The latter method has also been applied to circuits for demonstration of organic-based semiconductor thin-film devices (see for instance A. R. Brown & al."Logic gates made from polymer transistors and their use of ring oscillators", Science 270: 972–974, 1995).

Alternatively, screen printing with conducting "ink" has been used to make transistors on flexible polymer substrates (see for instance F. Gamier & al., "All-polymer field-effect transistor realized by printing techniques", Science 265: 1884–1886, 1994). Even though lithography may provide high resolution, it is relatively complex and includes wet chemistry steps that are undesirable in high-volume production of multilayer organic thin-film structures. Screen printing with ink is also far from ideal, as it only provides low to moderate resolution, and is a "wet" method.

U.S. Pat. No. 5,043,251 (Sonnenschein & al.) is an example of prior art that discloses a process for three-dimensional lithography of amorphous polymers for generating a momentary permanent pattern in a polymer material. The process comprises steps for providing doped non-crystalline layers or films of a polymer in a stable amorphous state under humane operating conditions. The film is masked optically and is exposed through the mask to radiation with sufficient intensity to cause ablation of the exposed portions to manufacture the patterns such that a distinct three-dimensional imprint is generated in the film. This process is used in the manufacture of optical data storage disks. Further it is from U.S. Pat. No. 5,378,916 (Mantell) discloses a photosensitive device in the form of a single-crystal structure, wherein different portions of the structure may have different compositions. Particularly, the structure forms a two-dimensional array. A first photosensitive portion comprises a material, which generates electron-hole pairs when it is exposed to light within a predetermined first wavelength range, while another photosensitive portion comprises a material which is adapted to generate electron-hole pairs when it is exposed to light within another wavelength range distinctively different from the first wavelength range. Still further, U.S. Pat. No. 5,677,041 (Smayling) discloses a transistor device that is made by forming a doped layer of radiation-sensitive material on a substrate. The radiation-sensitive material may among others be polyimid, polymer, an organic dielectric, a conductor or a semiconductor. The substrate can be silicon, quarts, gallium arsenide, glass, ceramic, metal or polyamid. A neutral or undoped layer of another radiation sensitive material is formed over the doped layer. First and second source/drain areas are then formed in the neutral layer and extend down to a top portion of the doped layer. A gate area is formed in the top portion of the neutral layer between the first source/drain area and the second source/drain area such that a channel area in the doped layer is provided under the gate area. Drain/source and gate electrodes are formed by irradiation of the uppermost neutral layer through a mask patterned in accordance with the desired electrode pattern and realized such that it intensity-modulates the radiation. In addition the mask may also be realized as a phase-shifting mask.

Finally, the article, "Polymeric integrated circuits and light-emitting diodes" of D. M. de Leeuw & al., IEDM, pp. 331–336 (1997) discloses a MISFET wholly realized in polymer. The polymer materials are given the desired electrical properties by exposure to UV radiation. In the manufacture photochemical patterning of doped electrically conducting polyaniline films, so-called PANI thin films is used. After the films are dissolved in a suitable solution, a photo-initiator is added to the solution that has been deposited on a suitable substrate, such as a polyimide film. After exposing the PANI film to deep UV radiation through a mask, the initially conducting polyaniline is converted to the non-conducting leucoemeraldine form in the exposed areas. Accordingly, the starting point is a conducting polymer material. The area resistance of the material is initially 1 kiloohm/square. After the exposure, the material obtains an area resistance of more than $10^{13}$ ohm/square. In this manner, dielectric structures can be generated in an otherwise conducting matrix. FIG. 1 shows a MISFET according to Leeuw et al. comprising a polyimide substrate 1 with a PANI thin film. After exposure to UV light through suitable masks, isolating structures 6 are formed in the otherwise conducting thin-film material 3. The still conducting areas 3 in the PANI film define the source and drain electrode of a MISFET transistor, respectively. Above the PANI film a further layer 4 is deposited in the form of a thin film of polythienylenevinylene or PTV that is an organic semiconductor material. This layer 4 substantially determines the electrical parameters of the MISFET transistor. A film 5 of polyvinyl phenol PVP that is opaque to UV radiation and visible light forms the gate isolator of the transistor and is deposited over the PTV film 4. Another PANI film is deposited on the top of the PTV film 5 and is patterned by radiation with UV light such that isolating structures 6 are formed. A still electrically conducting area 2 forms the gate electrode of the MISFET structure.

If several transistors of the kind mentioned above are combined in integrated circuits in the form of stacked film layers, vertical current paths must be used. For instance, vertical current paths can exist between source and drain electrodes in a transistor and the gate electrode in another transistor. Such vertical current paths can be realized mechanically, for instance, by depositing a metal film over vertically etched steps in the structure. The throughplated holes in a circuit board for forming a vertical connection between current paths on the upper and lower side of the circuit board are analogous to the vertical current paths.

SUMMARY OF THE INVENTION

An object of the present invention is to provide improved methods of fabricating conducting connections and electrodes in microelectronic components and microelectronic devices with large areas on flexible substrates. The method further provides high-volume fabrication at low costs. Particularly, it is an object of the invention to provide fabrication methods that can be used on layered physical devices, for instance, three-dimensional circuit structures formed by a large number of adjacent stacked thin-film layers. Thus, the present invention provides flexible, inexpensive, simple and precise fabrication of devices such as flat display devices, logic circuits, memory devices, and the like.

Further, it is also an object of the invention to provide a method for erasing such three-dimensional circuit structures in situ, such that the material in the structures is converted back to an initial virgin state. After the erasing process, the material by means of a suitable method can be reconfigured in the form of electrically conducting and/or semiconducting structures in three dimensions, for instance with another pattern or another structure than the original.

The above-mentioned features and advantages are realized according to the present invention with a method which is characterized by applying to a separate layer an electric field with given field strength and/or characteristics adapted to the specific response of the material to the energy supplied by the field. In each case the fields are modulated spatially according to a determined protocol which represents a predetermined pattern of electrically conducting and/or semiconducting structures in the relevant material structure. In response to the energy supplied by the field two-dimensional electrically conducting and/or semiconducting structures are generated in the layers with the pattern predetermined by the protocol. Then, two or more layers are optionally provided in a stacked configuration, such that the composite matrix formed by separate adjacent layers is provided with electrically conducting and/or semiconducting structures in three dimensions.

Further, it is advantageous that the electric field is modulated spatially in a plane substantially parallel with a layer by means of an electrode device with patterned electrodes. By selective supply of voltage to the electrodes according to the determined protocol, the electrode device generates electrical point or line potentials, which generate the electrically conducting and/or semiconducting structures.

According to another aspect of the invention, after generating the electrically conducting and/or semiconducting structure in each layer, it is advantageous that two or more layers form a stacked configuration. Each layer is combined into laminated multilayer structures that form the composite matrix with electrically conducting and/or semiconducting structures in three dimensions.

According to yet another aspect of the invention, it is advantageous to positioning the multilayer formed by a lamination of two or more self-supporting layers into a stacked configuration. After the lamination to adjacent layers, a first layer is then preferably positioned such that two or more two-dimensional electrically conducting and/or semiconducting structures in the first layer according to the protocol register with one or more two-dimensional electrically conducting and/or semiconducting structures in adjacent layers. Thus, one or more vertical electrically conducting and/or semiconducting channels are generated in the cross-direction through the layers.

Finally, it is according to the invention advantageous providing an electrically conducting and/or semiconducting structure which forms a vertical channel through the layer according to the protocol, in electrically conducting and/or semiconducting connection with one or more two-dimensional electrically conducting and/or semiconducting structures in this layer. Each channel preferably is generated with a conductivity or conduction mode which is constant between the layers or with a conductivity or conduction mode which varies between the layers.

A method for global erasing according to the invention is characterized by applying globally to the composite matrix an electric field with given field strength and/or characteristics adapted to the specific response of the material to the energy supplied by the field until the materials in their entirety arrive in the electrically conducting and/or non-conducting state in the composite matrix in response to the energy supplied by the field.

According to the another embodiment of the invention, an electric field generator/modulator comprises a first electrode means with a plurality of parallel strip electrodes provided in a plane. A second electrode means with a plurality of parallel strip electrodes is provided at a distance from the first electrode means and superpositioned thereto in a second plane parallel with the first plane such that the electrodes mutually are substantially orthogonally oriented in a matrix-like arrangement. The electrode means are connected with a controllable power supply over cross-connection devices. The space between the electrode means in the electrical field generator/modulator is adapted for receiving a thin-film material in the form of a discrete component or a continuous tape. The thin film material is fed through the space without touching the electrode means continuously or intermittently, and with simultaneous positioning and alignment spaced apart from and between the electrode means in a plane substantially parallel thereto. The electrically conducting and/or semiconducting structures can be generated according to a determined protocol by means of point, line or area potentials created between selected electrodes in the electrode means when electrodes are supplied with electric power over the cross-connection devices. Preferably, the electrodes in each electrode means are provided on or in surfaces of respective substrates facing each other and/or preferably are made as a part of the substrates and form conducting structures in the substrate material.

Further it is according to the invention advantageous that the distance between the electrode means is controllable depending on the thickness of the thin-film material.

Finally, it is according to the invention advantageous that the electrodes in each electrode means are provided with a mutual distance between 0.1 $\mu$m and 1.0 $\mu$m and that the electrodes in each electrode means are formed with substantially constant width of 0.1 $\mu$m to 1.0 $\mu$m.

BRIEF DESCRIPTION OF THE DRAWINGS

The invention shall now be explained in more detail in connection with a survey of its basic principles and with the use of exemplary embodiments in connection with the appended drawings, wherein.

DETAILED DESCRIPTION OF THE INVENTION

Figure 1:
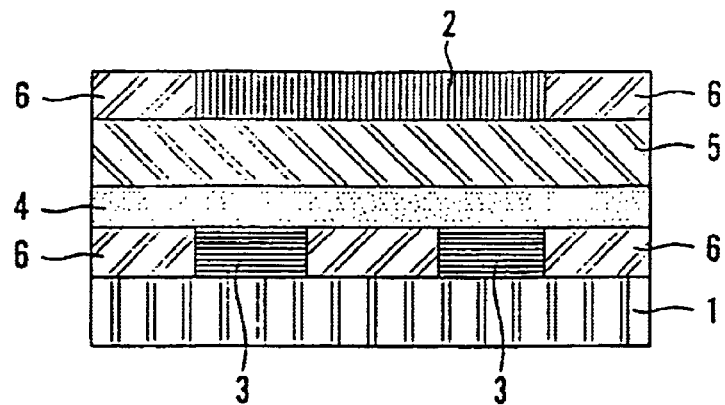
FIG. 1 shows a MISFET with the electrodes formed of photoconvertible material according to prior art.

Now the basic principles of a method according to the present invention whereby three-dimensional structures with a well-defined mode and degree of electrical conduction are generated by spatially controlled patterning in situ in convertible materials (CM). The convertible materials have properties such that their electronic properties are converted reversibly or irreversibly under the effect of radiation, heat, or electric fields. The method for generating such structures according to the present invention is based on the use of electric fields, either direct current fields or alternating current fields. Initially the three-dimensional electrically conducting and/or semiconducting structures can be generated as two-dimensional structures. The as two-dimensional structures are generated by direct local influence of the electric field on a single layer. Joining single layers into a multilayer structure forms three-dimensional structures. Typically an electric field-convertible material (EFCM) will be an organic material, for instance a molecule, an oligomer or a polymer where a phase transition from an initial first state to a new second state takes place upon being subjected to an electric field of a given field strength or with a given frequency.

As mentioned in the following, it is presupposed that the most important change taking place from the first to the second state, is the degree of electrical conduction. In the following, the method for generating and erasing electrically conducting and/or semiconducting structures by means of electric fields shall be discussed both generally and more specifically in connection with a description of the figures.

For polymers such as polyaniline conduction ratios between two states are observed as high as $10^{10}$, as shown in the above-mentioned paper by de Leeuw & al. This paper addressed in situ conversion of a single layer of irradiation convertible material from conducting to non-conducting state in order to generate electrical connections in a single electronic circuit. Electrically conducting connections in doped polyaniline films (PANI films) were defined by exposure to deep UV radiation through a patterned mask.

A multilayer stack of different electric field-convertible materials can be provided on a substrate, which can be flexible or rigid, and conducting or non-conducting. The field-convertible material is made conducting, semiconducting or isolating (i.e., non-conducting) in desired patterns by subjecting a number of single layer field-convertible materials to spatially-controlled electric fields. Subsequently, the layers can be combined into a multilayer stack. Multilayer stacks of field-convertible material are of particular interest in connection with multilayer thin-film circuits where it is required to generate electrically conducting lines, current paths, connection points or electrodes in several layers such that the conducting structures in one layer has a precisely controlled spatial relationship to the conducting structures in the layers which are located above or below. One example is thin-film field effect transistors (TFET) where the source and drain electrode in a layer must be correctly positioned relative to the gate electrode, and intervening isolating and semiconducting layers. Another example is electrical connections between the layers where traditional solutions in many cases are unsatisfactory. For instance, a number of steps such as forming open channels or vias between suitable points, which then shall be electrically connected in the different layers, can be incorporated with subsequent filling or casing of the channels with a conducting material. This is analogous to the use of through-plated holes in circuit boards to obtain a connection from the front to the back of the circuit board. In another example, capacitors are formed by defining conducting areas, which are aligned mutually opposite in two layers separated by an isolating layer. Highly conducting, isolating resistive and semiconducting patterns in multilayer structures are all aspects of the present invention. As will be explained in more detail in the following, patterns of this kind can be generated by using the method for generating electrically conducting and/or semiconducting structures or patterns according to the present invention. The following description emphasizes how patterns and three-dimensional structures are defined, which are good or poor electrical conductors.

Multilayer structures as described herein are of particular interest when they are integrated with thin-film semiconductors in order to form complete circuits. Conventional procedures for fabricating microelectronic circuits, which exploit the semiconducting properties of a common silicon substrate, restrict automatically the realizable architectures to the kind that allows access to the substrate for all active devices. If the method according to the present invention is used for generating electrically conducting and/or semiconducting structures in three dimensions by means of converted single stacked single layers, then whole devices can be generated in without any essential restriction with regard to the size or complexity because scaling simply takes place by joining more layers to the stack. Since each layer can be made thin, for instance with an order of magnitude of 10–100 nm, the resulting volumetric density for the circuit patterns and hence the performance per weight or volume unit can be extremely high. Further, hybrid architectures can be realized with the use of layers which include electrical field-converted electronic structures which are formed on the top of and function in cooperation with traditional silicon-based electronic circuits.

An object of the present invention is the generation of electrically conducting, semiconducting or resistive structures in three dimensions within a multilayer material in monolithic format. The structures are generated by electric fields in the form of point, line or area potentials. An embodiment of the method is now described with reference to FIGS. 2a–f.

Figure 2A:
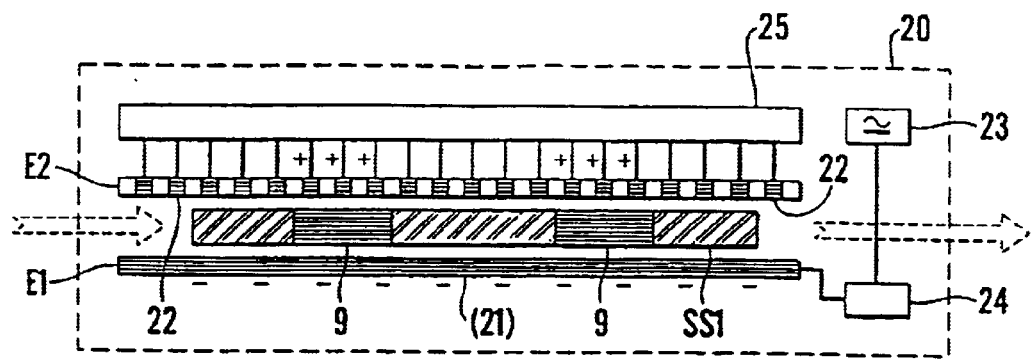
FIGS. 2a, b schematically respectively in section and plan view an embodiment of the electric field generator/modulator (EFGM) according to the invention and its use in a first step in the method for generating according to the invention.
Figure 2B:
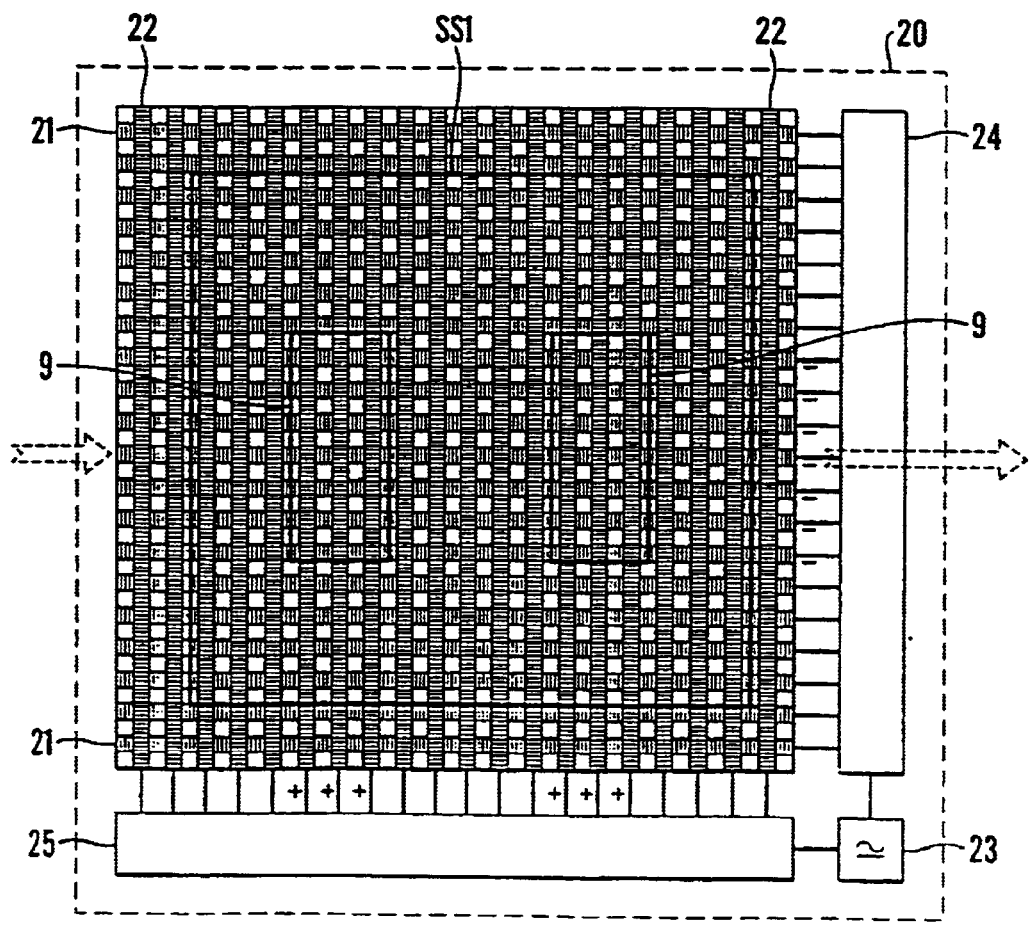
FIGS. 2c, d schematically in respectively section and plan view EFGM as shown in FIGS. 2a, b and used in a second step in the method for generating according to the invention.
FIGS. 2e, f schematically in respectively section and plan view EFGM as shown in FIGS. 2a, b and used in a third step of the method for generating according to the invention.

FIG. 2a shows a section through an electric field generator/modulator according to the invention that functions as an electric patterning device for electric field-convertible materials. The electric field generator/modulator is realized such that it both generates the field and modulates the fields spatially, i.e., in a plane or two-dimensions, thereby generating electrically conducting and/or semiconducting structures with the desired pattern in this plane. In the following, the electric field generator/modulator is denoted as EFGM. As shown in FIG. 2a in section and in FIG. 2b in plan view, EFGM 20 comprises a first electrode means E1, consisting of thin parallel electrodes 21 and another electrode means E2 provided spaced apart from the electrode means E1 in a plane parallel thereto. The electrode means E2 consists similarly of thin parallel electrodes 22 provided such that they are oriented substantially orthogonal to the electrodes 21 in the electrode means E1. The electrode means E1, E2 are connected with a power supply 23 hown as a direct voltage power supply. However, the power supply 23 may also be an alternating voltage power supply. The power supply 23 is connected with the electrode 21, 22 in the electrode means E1, E2 over respective cross-connecting devices 24, 25. The distance between the electrode means E1, E2 allows a thin film of electrical field-convertible material EFCM, in FIG. 2a denoted as SS1, to be inserted between the electrode means E1, E2, without contacting these electrodes. The electrode means E1, E2 can be formed of self-supporting or supported thin films, wherein the electrodes 21,22 in each case are embedded in the film material. Similarly, the layer SS1 of the field-convertible material EFCM can be a continuous tape that is inserted in EFGM 20 between the electrode means E1, E2 in a substantially continuous movement. By applying voltage, e.g., to an electrode 21 in the electrode means E1 and to an electrode 22 in the electrode means E2, an electric field perpendicular to the layer SS1 is formed in the intersection between the electrodes 21 and 22. The field-convertible material SS1 can transform from a non-conducting to a conducting state in areas that are influenced by the field between the electrodes 21, 22. If an electrode 21 and another electrode 22, respectively, are addressed electrically in this manner, an approximate point potential is obtained in the intersection between. For example, if an electrode 21 in the electrode device E1 and all electrodes 22 in the electrode device E2 are addressed, a field is obtained substantially in the form of a line potential along the electrode 21 in question. Correspondingly, a line-like structure will be generated, for instance an electrically conducting structure in the layer SS1 which is located between the electrode devices E1, E2. If a number of electrodes 21 that are located juxtaposed to each other in the electrode device E1 and correspondingly a plurality of electrodes 22 which are juxtaposed to each other in the electrode device E2, the field created between the electrode intersections generates an area potential. For instance, an electric area structure can be generated in the layer SS1 by this field. In FIGS. 2a, 2b, these electrically conducting structures are generated substantially as area structures. However, point or line structures can be generated depending on the manner whereby the electric field is generated.

Figure 4:
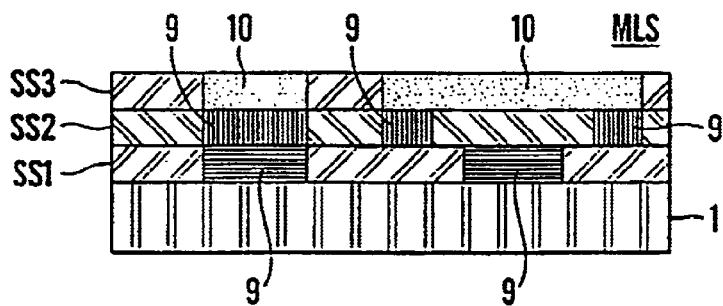
FIG. 4 a section through a multilayer structure with conducting and/or semiconducting structures as generated by the steps shown in FIGS. 2a–f.
Figure 2C:
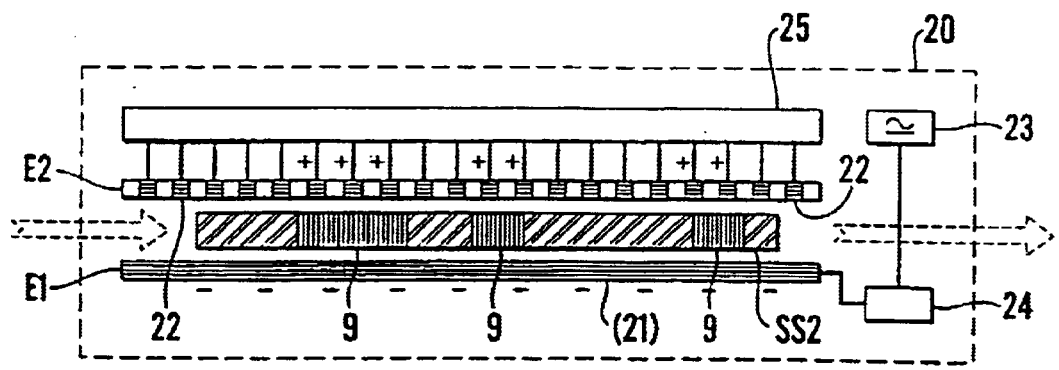
Figure 2D:
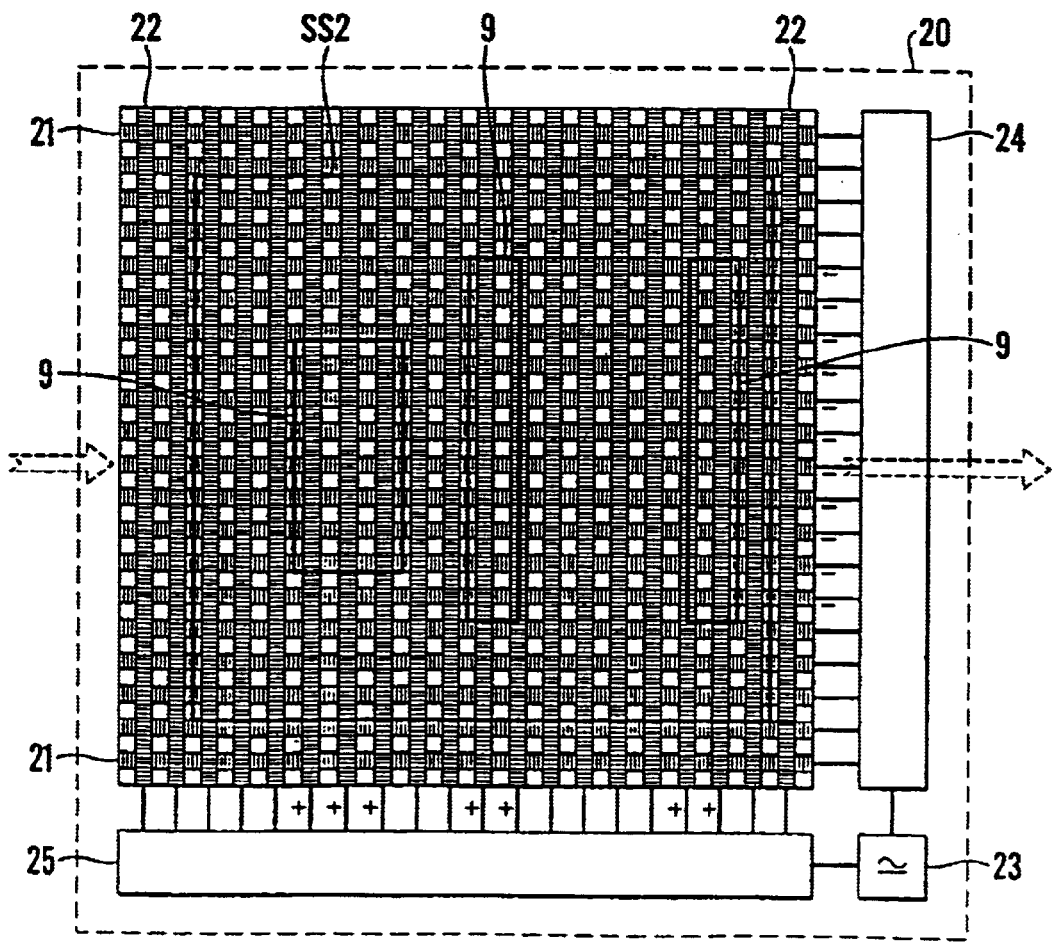
Figure 2E:
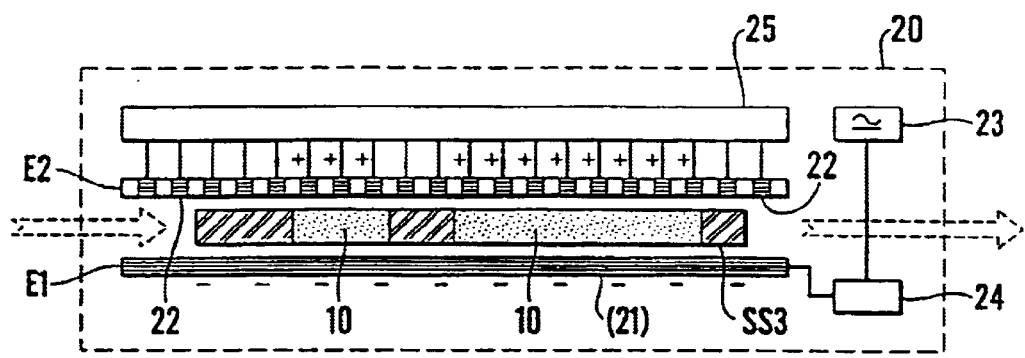
Figure 2F:
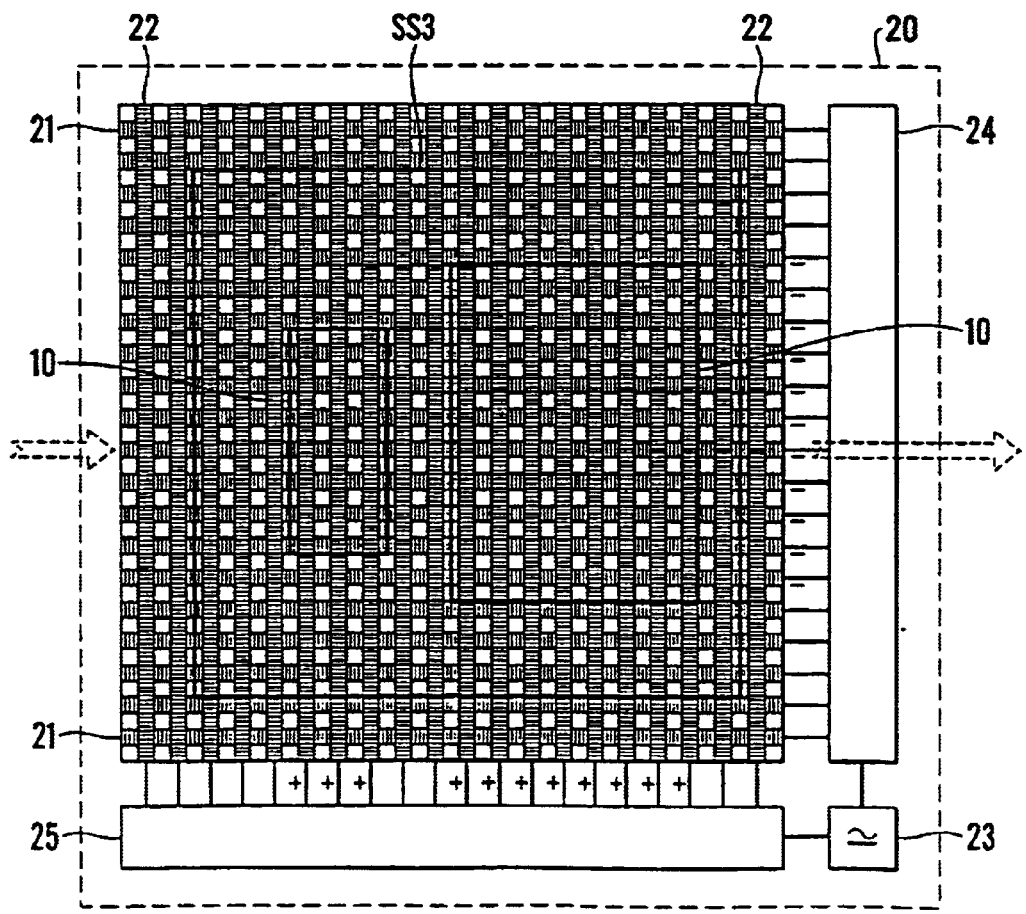
Figure 3:
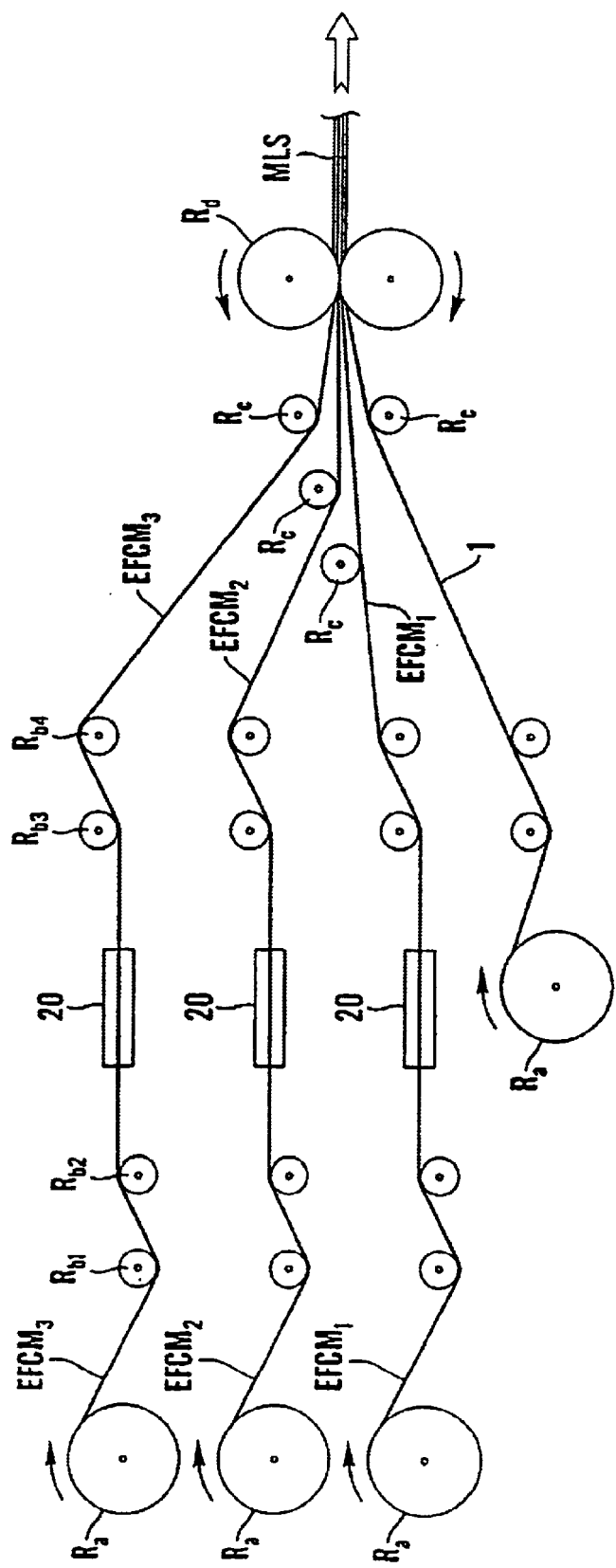
FIG. 3 schematically the embodiment of the method for generating according to the invention, combined with a lamination of single layers into a multilayer structure.

FIGS. 2c and 2d show respectively in section and plan view how EFGM 20 is used for generating electrically conducting structures 9 in a second layer by addressing the electrode means E1, E2 in EFGM 20 in a suitable manner. Correspondingly, FIGS. 2e, f show in section and plan view EFGM 20 with a third layer SS3. Layer SS3 is patterned with semiconducting structures 10. As shown in FIGS. 2a–f, the patterning of the field-convertible material EFCM takes place for each separate layer SS1, SS2, SS3. However, as mentioned above these layers can be present in the form of self-supporting single films of EFCM and assembled into a multilayer stack, which schematically is shown in FIG. 3. The fabrication of circuits realized with electrically conducting and/or semiconducting structures in EFCM can take place with tapes of EFCM in continuous paths as shown. Each tape or each film, shown in FIG. 3 as three films EFCM1, EFCM2, EFCM3, is converted by electric field to the desired spatial pattern in a separate EFGM 20 for each of the paths. Then, the layers are assembled into a multilayer structure MLS, e.g., by gluing or heat-assisted lamination. The multilayer structure MLS can be provided on a substrate that is not subjected to any electric field. However, the substrate is laminated to the multilayer structure MLS in the same process step. In each case a flexible tape MLS is obtained that either can be folded, coiled or cut into segments, for instance, to make single circuits. In FIG. 3, the field-convertible material EFCM in the form of three tapes or films EFCM1, EFCM2, EFCM3 is drawn from respective rolls $R_a$ and conveyed in separate lines by alignment rolls $R_{b1}, R_{b2}, R_{b3}, R_{b4}$ in each line for tensioning and positioning of the tapes through EFGM 20. The completed patterned films EFCM1, EFCM2, EFCM3 are conveyed over a guide roll set $R_c$. Possibly after a further position adjustment, a lamination step $R_d$ laminates the completed patterned films EFCM1, EFCM2, EFCM3 into the multilayer structure MLS. This multilayer structure can include a substrate 1, which is drawn from a further roll $R_a$ in a separate line. The substrate 1 is laminated together with the converted film material EFCM in the lamination step $R_d$. Three layers, which are laminated together in this manner and converted as shown in FIGS. can be represented schematically in section view as shown in FIG. 4. A circuit structure is thereby provided on the substrate 1. The conducting structures 9 and the semiconducting structures 10 contact each other vertically or extend horizontally in each of the layers SS1, SS2, SS3 as shown. Together, the conducting structures 9 and the semiconducting structures 10 form three-dimensional structures in the desired pattern.

The electrode means E1, E2 in the electric field generator/modulator (EFGM 20), as shown in FIG. 2a and FIG. 2b, can be formed in or on substrates of a non-conducting material. The electrodes 21, 22 can be provided on the opposite surfaces of the substrates or embedded in the substrates. They may also form conducting structures in the substrate material itself. The electrode width and the mutual distance between the electrodes 21, 22 in each electrode means E1, E2 is determined for the spatial resolution in the patterning of the conducting or semiconducting structures and the achievable pitches. In compatibility with today's semiconductor technology, the electrodes 21, 22 can be realized with a width between 0.1 and 1.0 $\mu$m and corresponding mutual distances. It is possible to realize widths, e.g., in thin films provided on substrates, of 0.1 $\mu$m or less by nanotechnology printing methods, or by means of chemical methods. The circuit patterns that are realized with EFGM20 according to the present invention are at least dimensionally compatible those achieved by using microlithography in silicon-based circuit technology, for instance. Depending on the thickness of the thin film material wherein conducting or semiconducting structures (i.e, circuit patterns) are generated, the distance between the electrode devices E1, E2 can be controlled to achieve an optimum definition of the potentials formed between the electrodes. The control may take place via micromechanical servocontrol means (not shown), which are well-known to persons skilled in the art. During the generation of the circuit pattern, the space between the electrodes can be filled with an isolating gas with high dielectric strength in order to prevent breakdown between the electrodes.

The power supply 23 in EFGM 20 (e.g., as shown in FIGS. 2a and 2b) may either be a direct current source or an alternating current source. Preferably, power supply 23 is a controlled power supply and able to supply the electrode means E1, E2 with current with different modes and characteristics. For this purpose both the power supply 23 and the cross-connection means 24, 25 can be connected with an external control device (not shown) that can be programmed according to the protocol for a desired circuit pattern and corresponding control the generation of the desired electrically conducting and/or semiconducting structures in the layer material or the thin film material between the electrode means E1, E2. Protocols and required software can be loaded to the control device (not shown) from any external source. Therefore, the fabrication of circuits using EFGM 20 and the above method can be managed from a distant locality.

A detailed discussion of the electric field-convertible materials EFCM that can be used in the method according to the present invention and specific techniques that can be used in an embodiment of said method follows. The basic principle of in situ field-conversion of materials is to generate conducting or semiconducting structures by means of spatially modulated and/or field strength modulated electric fields. Additionally, the conversion itself may be reversible or irreversible. Concrete examples are provided below. EFCMs are in an early development stage. It is expected that ongoing research and development activities in this field will dramatically increase the number of available materials.

In the present invention, it is particularly preferred to use EFCMs which by being subjected to an electric field remain in an altered state (e.g., conducting and/or semiconducting) until they again are subjected to a field which brings the material back to the initial state (e.g., non-conducting). This is the case of different organic macromolecules and other materials that generally are known as molecular electronic materials. A material of this kind is disclosed in the paper "A new material for optical, electrical and electronic thin film memories" by Z. Y. Hua & G. R. Chen, Vacuum, Vol. 43, No. 11: 1019–1023 (1992). This material is an organometallic charge-transfer complex M (TCNQ) formed by TCNQ (7,7, 8,8tetracyanoquinodimetan, $C_{12}H_4N_4$) which functions as an electron acceptor molecule with different metals as electron-rich donors. The metals can be Li, Na, K, Ag, Cu or Fe. M (TCNQ) may transfer from a high impedance state to a low impedance state in response to the application of electric fields or energy supplied in the form of heat or light radiation. Generally the reaction can be written as

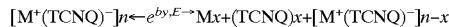

The process is reversible, as the return reaction can be obtained by supplying energy $\epsilon$ in the form of heat, electrical fields or photon radiation. Because the reversible reaction, M (TCNQ) can be used for generating a bistable switching medium, such as an erasable memory material. Only electric fields are used in methods according to the present invention. Irradiation is not used. In thin layers, for instance of 100–200 nm, M (TCNQ) has non-liner current-voltage characteristics, which can be used for realizing memories of the type ROM and RAM. It is of particular interest that M (TCNQ) stably and reproducibly allows current-controlled bistable electrical switching. For instance, in an electrically addressable memory, the high impedance state can represent binary 1 and the low impedance state binary 0. The transition time between two such states is less than 400 ns. Further examples of relevant materials are discussed in W. Xu & al., "Two new all-organic complexes with electrical bistable states", Appl. Phys. Lett. 67: 2241–2242 (1995) and the appended literature references therein. The materials mentioned are bistable and have well-defined thresholds for conversion from conducting to non-conducting state and vice versa with the use of electric fields.

In certain field-convertible materials, including TCNQ, the conversion from a non-conducting to a conducting state may also take place when the energy is supplied in the form of the heat. As the field-convertible material basically is dielectric or strongly resistive, an electric alternating field applied via the electrodes with a suitable frequency to the material may induce heat in the potential area. The heating causes a subsequent conversion of the material from a non-conducting to a conducting state in this area. The power supply is then operated as an alternating power supply and the thermal conversion is regarded as a secondary effect induced by the electric field. In order to obtain good spatial definition of the generated electrically conducting and/or semiconducting structures, the thermal field induced by the alternating field in the material is precisely controlled. The thermal field will propagate through the material and cause a temperature increase that may influence the electrical properties of the material outside the potential area. Ideally the potential area defines the spatial extent of the generated structure. If the field-convertible material is regarded as an infinite thin layer, the temperature increase extends a distance from a point potential which falls together with the intersection point of the activated electrodes, with a thermal diffusion length defined by the formula $$\mu = (\kappa/\pi f \rho c)^{1/2} \qquad (1)$$

where the material parameters $\kappa$=thermal conductivity, f=1/$\tau$ the characteristic frequency which is≡the inverse of the pulse duration $\tau$, p=the density of the material, and c=the specific heat of the material.

It follows from equation 1 that in order to reduce the thermal diffusion and obtain a sharp spatial definition of the desired electrically conducting or semiconductor structures, an alternating current pulse should be used which provides high field strength and a fast temperature increase in the potential area with subsequent rapid conversion of the field-convertible material. This can be achieved by combining a high field strength with high field frequency and with the use of field-convertible materials in the form of thin films with a thickness of 100 nm. Effectively, unwanted thermal diffusion can be avoided by using alternating current pulses of at most a few microseconds. The field characteristics are also tuned to the desired degree of conductivity on the potential areas, which ideally defines the generated conducting and/or semiconducting structures.

Electrical connections between different layers in thin-film materials or other types of electronic materials present a major challenge for the fabrication of microelectronics. Precise positioning of conducting paths in each layer plane and in the perpendicular direction to the planes is of paramount importance and comprises typically forming vias or holes which can be filled with conducting material in order to create connections perpendicular to the layers. The physical manufacture of the holes in the prior art takes place by means of drilling, punching or etching, and the conducting material is added by mechanical filling, electroplating, etc. Very clearly processes of this kind represent a significant complication and a substantial cost with an accompanying limited precision.

Figure 5:
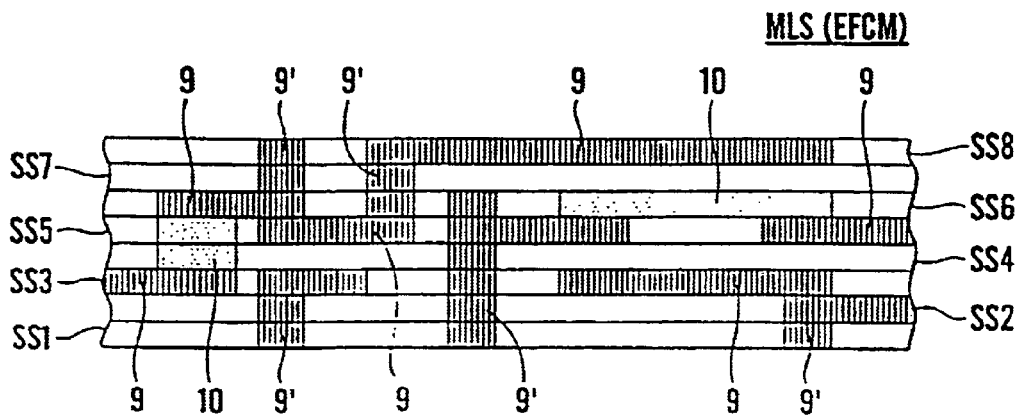
FIG. 5 a schematic section through a laminated multilayer structure which comprises conducting or semiconducting structures generated by the method according to the present invention.

In the present invention the connections, as well as active and passive devices can be generated in the same processing sequence which defines the electrically conducting and/or semiconducting structures in each layer, i.e., with the same kind of spatial precision as the structures themselves and without resorting to further and other types of manufacturing steps. FIG. 5 shows the basic principle for the particular case where a single conducting path 9 shall be generated between a portion of a conducting structure in a layer SS5 and a portion of another conducting structure 9 in a layer SS8 spaced apart from the former. By repeated conversion of a small area in the same location of each of several adjacent layers between the termination points of a conducting or semiconducting structure, a column 9' of conducting material is formed as shown in FIG. 5. Electrical conductivity is obtained stepwise from the starting layer SS5, which contains the first conducting structure, to the final layer SS8 which contains the second conducting structure. The cross-section of column 9' can be defined arbitrarily via the selected electric field pattern. A number of parallel conducting columns can be generated by direct extension of this procedure. The columns can begin and end in different layers, such as shown in FIG. 5. In a given layer which contributes a conducting structure 9 in connection with one or more conducting columns of vertical conducting structures 9', the latter shall be made concurrently with other conducting 9 or semiconducting structures 10 which are patterned in this layer, for instance, SS6 in FIG. 5 (i.e., without having to carry out other or different processing steps). Typically the degree of conversion from a non-conducting to a conducting state or vice versa can be controlled by the field strength and/or its time characteristics, and possibly also by the duration of the field. Thus a column, which connects points in two different layers, can be formed such that it functions as a resistor in a circuit by choosing the degree of conductivity in segments from layer to layer along the column.

Additionally, a method for erasing electrically conducting and/or semiconducting structures generated in three dimensions forms a part of the invention.

In principle electrically conducting and/or semiconducting structures in single layers can be erased selectively with the use of EFGM20 as shown in any of the FIGS. 2a–f and suitable spectral modulation. However, after joining single layers into a multilayer structure MLS, the erasing at time being can only be performed globally The multilayer structure, in case the matrix, is globally subjected to an electric field with given field strength and/or characteristics and possibly adapted to the specific response of the material to the energy supplied by the field. The materials in the matrix will then be reconverted until the matrix in its entirety arrives in an electrically non-conducting state. This is the case if the matrix is made of a material such as M (TCNQ). A multilayer structure or matrix of M (MTCNQ) material may thereafter be reconfigured with new electrically conducting and/or semiconducting structure, but this is not possible by using electrical fields according to prior art techniques. However, another method can be used as disclosed by the simultaneously filed International Patent Application PCT/N099/00023 which belongs to the present applicant.

According to the present invention, the method for generating provides that suitable materials can be converted from an isolating to a semiconducting state or vice versa by electric fields, either directly or indirectly (e.g., in the last instance due to a simultaneous local heating). It is possible to apply the method to manufacture diodes and transistors that can be connected electrically with resistances and capacitors to form complete active electronic circuits. More specific examples of active components and circuits formed thereof shall be disclosed by the following examples.

EXAMPLE 1

Figure 6:
FIG. 6 a schematic section through a diode structure generated by the method according to the present invention.
Figure 6:
Figure 6:
Figure 6:
Figure 6:
Figure 6:
Figure 6:
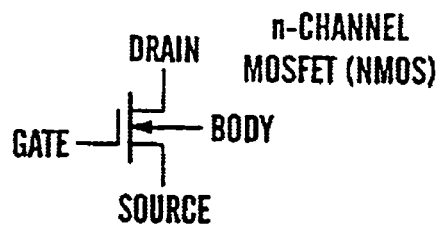
Figure 6:
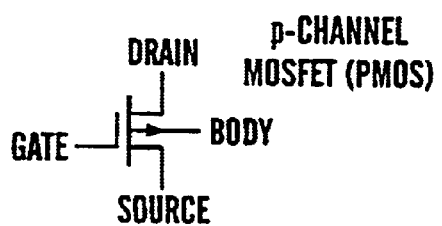
Figure 6:
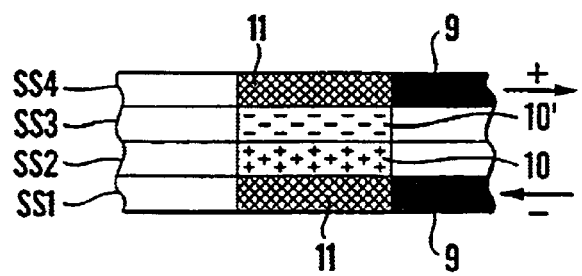

FIG. 6 shows a forward-biased pn junction diode with conducting and semiconducting structures generated according to the invention and realized in thin-film technology with four sublayers SS1–SS4. The layers SS2 and SS3 contain the active semiconducting material provided between the electrodes 11 in sublayers SS1 and SS4, respectively. The active material 10 in sublayer SS2 is an n-doped semiconductor, while the adjacent active material 10 in sublayer SS3 is a p-doped semiconductor. The electrodes 11 in the layers SS1 and SS4 are contacted by horizontal electrically conducting structures or conducting paths 9 in the same layer. Each separate layer in the diode structure of FIG. 6 typically has a thickness of about 100 nm, such that the whole structure forms a multilayer structure with a thickness less than 1 $\mu$m. The horizontal extension of the area of the diode structure will be determined by the spatial resolution of an EFGM. However, it is possible to form electrodes 21, 22 of the electrode means E1, E2, as shown in FIGS., 2a–f, with pitches in the order of magnitude 0.2–1.0 $\mu$m. These electrodes can be formed using conventional lithographic methods or by using irradiation convertible materials and a method as disclosed in the above-mentioned international patent application PCT/N099/00023. Special printing methods or use of nanotechnological and chemical methods will be able to realize electrode structures that are one order of magnitude smaller. Realistically with the available technologies for making the electrode devices it will be possible to modulate point and line potentials spatially in two dimensions to a smallest extension of 0.1 $\mu$m.

EXAMPLE 2

MOSFET

Figure 7:
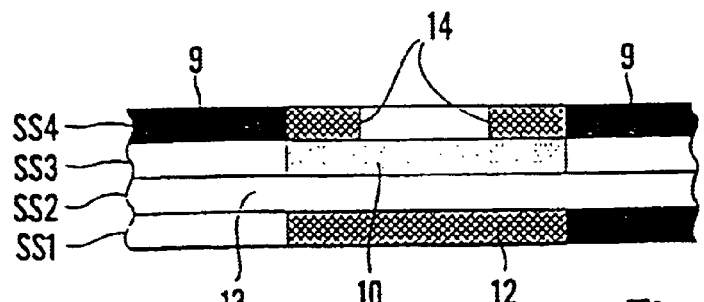
FIG. 7 a schematic section through a MOSFET structure generated by the method according to the present invention.

FIG. 7 shows schematically a MOSFET for use in the present invention and realized wholly in organic material in thin-film technology. The gate electrode 12 is provided in the sublayer SS1 and connected with a horizontal conducting structure 9, while the sublayer SS2 constitutes the gate isolator 13. The active semiconducting material 10 is provided in the sublayer SS3 and registers with the gate electrode 10. The source and drain electrodes 14 are provided in the following top layer SS4 and are contacted by horizontal electrically conducting structures 9 in the same layer. Each of the layers comprises either electrically conducting structures or a semiconducting structure, as well as dielectric areas. The thickness of a MOSFET of this kind can be ½ $\mu$m, while the extension in the horizontal plane can be from at most a few $\mu$m to less than 1 $\mu$m, cf. what is said in example 1.

EXAMPLE 3

Logic CMOS Inverter

Figure 8:
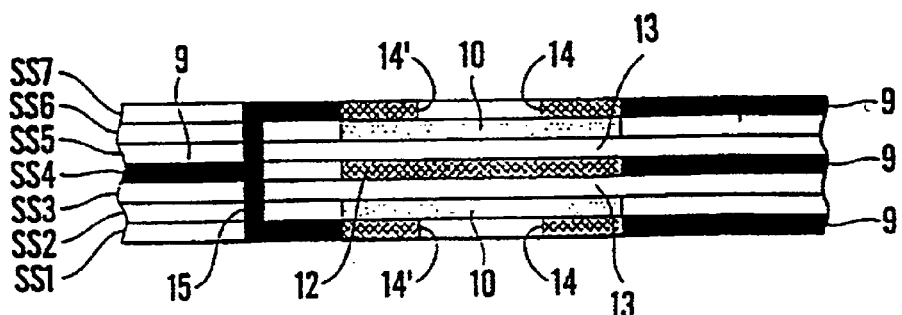
FIG. 8 a schematic section through a logic inverter structure based on the MOSFET structure in FIG. 7 and generated by the method according to the present invention.

The MOSFET structure in FIG. 7 may now be used in logic gates, for instance a logic inverter in CMOS technology as shown in FIG. 8. An inverter of this kind is formed by parallel connection of the drain and source electrode in respectively an n-MOSFET and a p-MOSFET in a back-to-back configuration, with common gate electrode. For this purpose a vertical conducting structure 15 is generated and passes through all sublayers SS1–SS7 and connects the electrodes 14'. The output signal from the inverter is conveyed on this conducting structure 15 to a horizontal connecting structure 9 at left in the figure. The common gate electrode 12 of the MOSFET receives the input signal via the horizontal conducting structure 9 in the sublayer SS4 at right in the figure. The thickness of all sublayers is less than 1 $\mu$m, typically realized with about a thickness of about 0.7 $\mu$m, while the horizontal extension of the inverter will have the same dimensions as stated above in connection with the discussion of the MOSFET structure in the FIG. 7.

EXAMPLE 4

CMOS AND Gate

Figure 9:
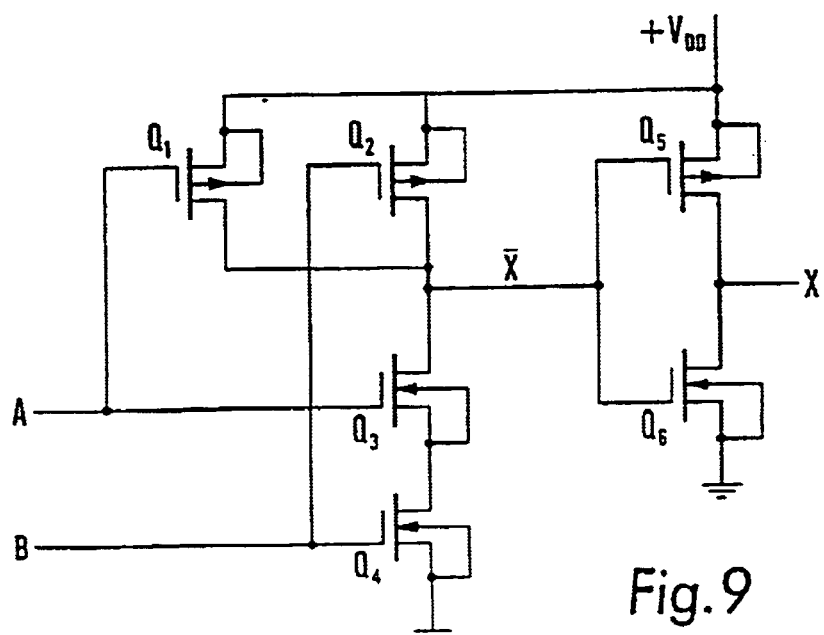
FIG. 9 the equivalent diagram of an AND gate realized in CMOS technology.

Active components like the MOSFET structures shown in FIG. 7 can be used for forming integrated circuits by stacking the sublayers with structures which have the desired electrical properties and wholly are realized in an organic thin-film technology. Specifically, the following example is an AND gate realized in CMOS technology with the use of the transistor structure as shown in FIG. 7. In order to facilitate the understanding of how active devices such as field-effect transistors can be combined in multilayer structures and into functional devices, for instance logic gates, reference shall be made to FIG. 9. FIG. 9 shows the circuit diagram for an AND gate realized in complementary MOS technology (CMOS technology). The CMOS AND gate is realized with n-MOSFETS and p-MOSFETS of the enrichment type as switches, respectively. Two input signals A and B are conveyed respectively to the gate electrodes on p-MOS $Q_1$ and $Q_2$ and the gate electrodes on n-MOS $Q_3$ and $Q_4$. If both input signals switches A and B are high, the output signal $\overline{X}$ will be low. In this case $Q_3$ and $Q_4$ will both be on and the p-MOS switches $Q_1$ and $Q_2$ will both off, i.e., no current flows and the output signal $\overline{X}$ hence goes low. If, on the contrary, either the input signal A or the input signal B is low or both are low, the p-MOS transistors $Q_1$, $Q_2$ will be switched on and the output signal $\overline{X}$ goes high, because either one or both of the serially connected n-MOS transistors $Q_3$, $Q_4$ are off and no current flows. The devices $Q_1$, $Q_2$, $Q_3$, $Q_4$ realize a NAND gate To realize an AND gate it is necessary to connect the output of the NAND gate with a logical inverter which also is realized in CMOS technology with the use of a p-MOS switch $Q_2$ and an n-MOS $Q_6$ switch connected in parallel. This is a standard CMOS inverter. If its input signal $\overline{X}$ is high, its output signal X is the inverse of the input signal $\overline{X}$ and hence low. Conversely a low input signal $\overline{X}$ is inverted to a high output signal X. This corresponds to the input signals A and B to the NAND gate both being high. Circuits such as the AND gate shown in FIG. 9 can be realized with any number of inputs. Correspondingly, persons skilled in the art will understand that logic OR and NOR gates can easily be realized. In principle, all Boolean functions can be realized in combinations of one type of gate and one or more inverters realized in CMOS technology, for instance, with the use of the transistor structure as shown in FIG. 7.

Figure 10A:
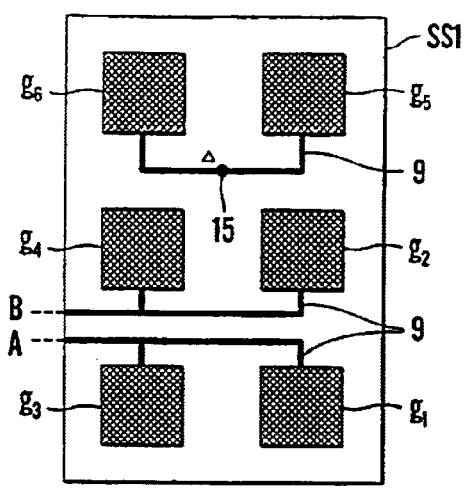
FIGS. 10a–d in plan view sublayers in an AND gate structure generated by the method according to the invention and according to the equivalent diagram in FIG. 8 with the use of MOSFET structures as shown in FIG. 7.
Figure 10B:
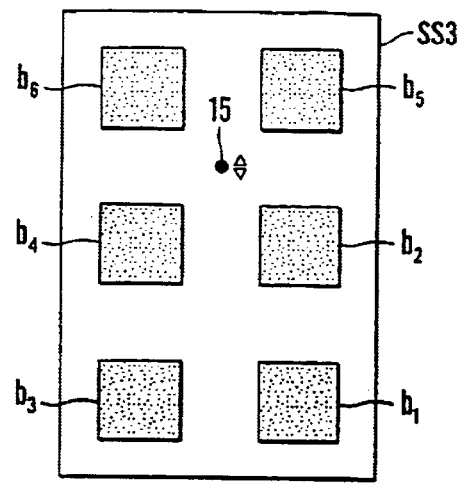
Figure 10C:
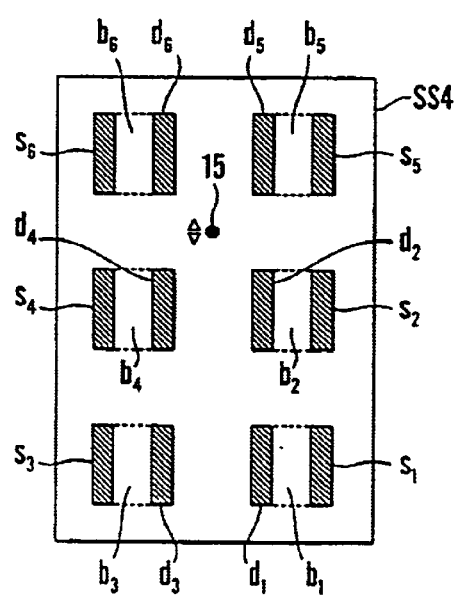
Figure 10D:
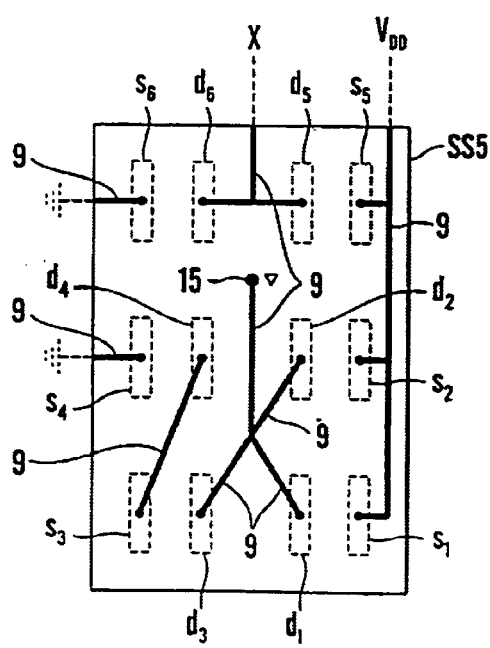
Figure 11:
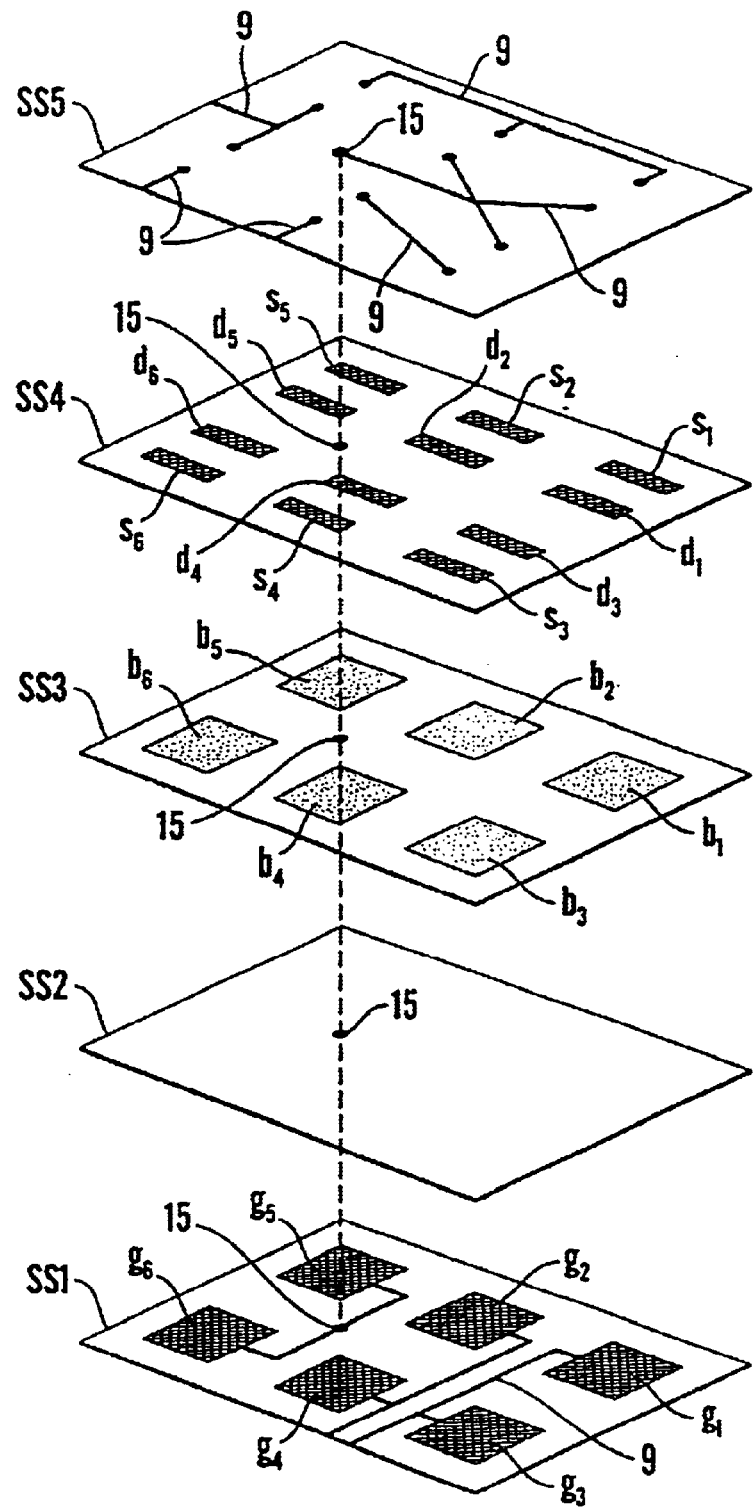
FIG. 11 the AND gate structure in FIG. 10 as a stacked multilayer configuration, but exploded in the separate sublayers.

The AND gate can be implemented in thin-film technology as shown in FIGS. 10a–10d and with the use of MOSFET structures corresponding to that shown in FIG. 7. FIGS. 10a–10d show the AND gate wholly realized in thin-film technology with the active and passive devices provided in four sublayers SS1, SS3–SS5. The first sublayer SS1 (FIG. 10a) contains the gate electrodes $g_1$–$g_6$ where the subscript points to the corresponding subscript for the MOSFETs $Q_1$–$Q_6$ in FIG. 9. The inputs A and B are conveyed to respectively the gate electrodes $g_1$, $g_3$ and $g_2$, $g_4$ and via horizontal conducting structures or current paths 9. Correspondingly the gate electrodes $g_5$, $g_6$ in the inverter are connected with a horizontal current path 9. A vertical electrically conducting structure is denoted as 15. The symbol Δ indicates that it extends upwards in vertical direction from the sublayers SS1. In FIG. 10b, the symbols Δ and ∇ indicate that the vertical conductor structure 15 in the layer SS3 extend vertically through this layer and on both sides thereof. The layer SS3 comprises areas with active semiconductor materials $b_1$–$b_6$ (corresponding to 10 in FIG. 7) which are assigned to and register with the corresponding gate electrodes $g_1$–$g_6$ in the layer SS1. It is to be remarked that a layer SS2, apart from the vertical conductor structure 15 which also extends through this sublayer on both sides thereof, exclusively consists of dielectric material which forms a common gate isolator for the MOSFETs $Q_1$–$Q_6$ which realize the AND gate. The layer SS2 is located between SS1 and SS3, but has been excluded from the drawing. The layer SS4 in FIG. 10c is provided above and adjacent to the layer SS3 and comprises the source electrodes $S_1$–$S_6$ and the drain electrodes $d_1$–$d_6$ for the corresponding MOSFETs $Q_1$–$Q_6$, respectively. The active semiconductor material $d_1$–$d_6$ that is located in layer SS3 is here indicated by stitched lines. The vertical current path 15 also extends also through the layer SS4 and to both sides thereof and contacts a horizontal current path 9 in the sublayer SS5 as shown in FIG. 10d. This horizontal current path corresponds to the connection between the drain electrodes $d_2$ and $d_3$ for the corresponding MOSFETs $Q_2$, $Q_3$ and is additionally also connected with the drain electrode $d_1$ on $Q_1$. Another horizontal current path 9 realizes the serial connection between the source electrode $s_3$ on $Q_3$ and the drain electrode $d_4$ on $Q_4$. The source electrodes $s_4$ and $s_6$ are grounded over further horizontal conductor structures 9, while the horizontal conducting structure 9 farthest to right in the layer SS5 is supplied with a voltage $V_{dd}$ and connects the source electrodes $s_1$, $s_2$, $s_5$ on $Q_1$, $Q_2$ and $Q_5$, respectively. A further horizontal current path 9 uppermost in FIG. 10d forms the parallel connection between the drain electrodes $d_5$, $d_6$ on $Q_5$, $Q_6$ and the output line, denoted with X. The output signal $\overline{X}$ from the NAND gate consisting of $Q_1$, $Q_2$, $Q_3$, $Q_4$ is conveyed on the vertical current path 15. FIG. 11 shows schematically how the layers in FIG. 10 appear in stacked configuration. The layer SS2 (i e, the gate isolator) is included. However, for the sake of clarity the stack is shown exploded in its separate sublayers SS1–SS5 with correct registration. The course of the vertical current path 15 through every sublayer is indicated by the stitched line. With the gate electrode layer SS1–SS5 provided on an underlying (not shown) dielectric layer, the total AND structure as shown in FIG. 11 may have a thickness of 0.75 μm and an area of about 100 μm² (12–8 μm²). The volume of the structure will hence be about 75 μm³. With conservative spatial resolution this implies that about 10,000 logic gates of this kind can be realized on an area of 1 mm² and with a thickness well below 1 μm. Correspondingly scaled, the length of the current paths 9,15 together is 60 μm.

EXAMPLE 5

AND Gate with Vertically Stacked CMOS Circuits

Figure 12:
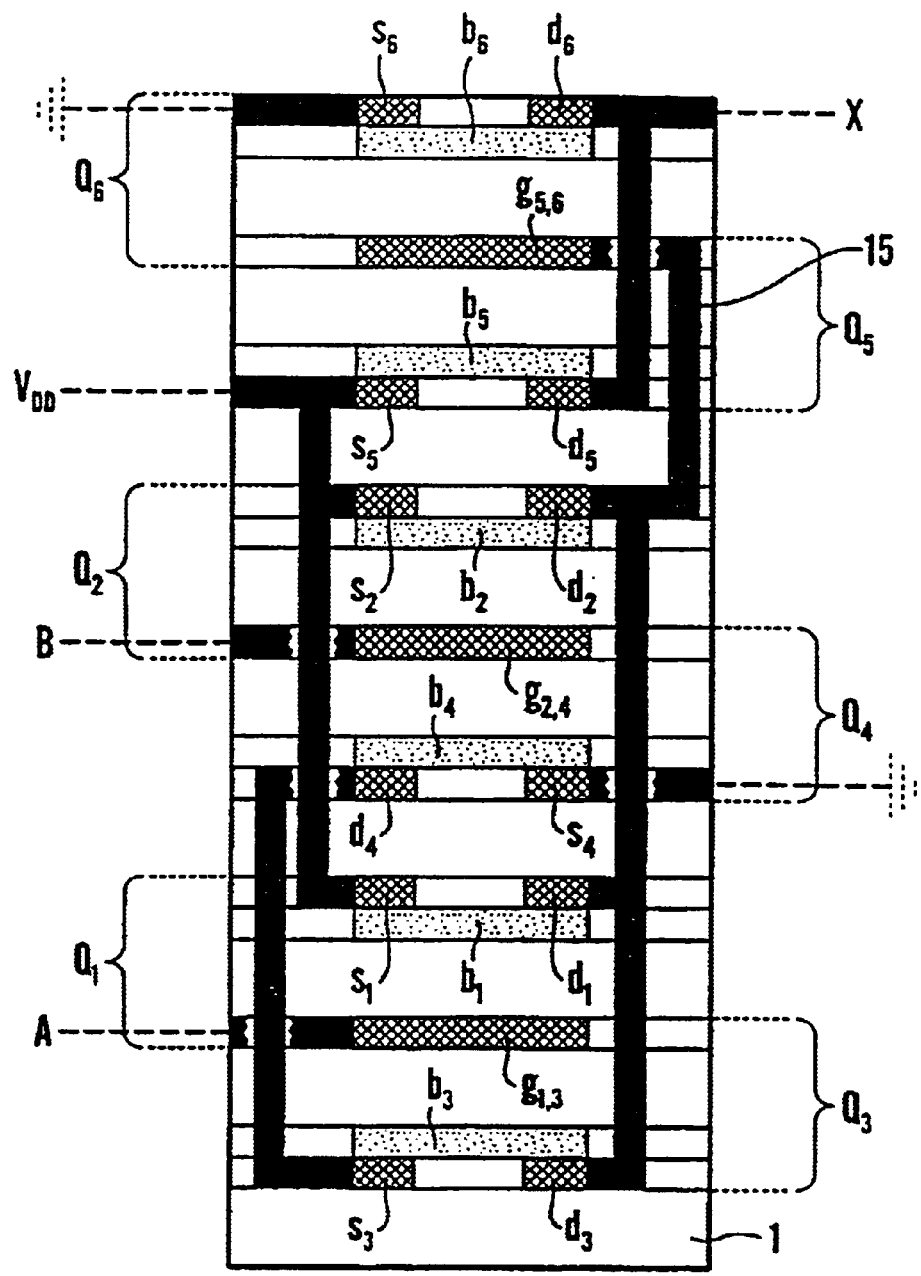
FIG. 12 schematically another variant of the AND gate structure in FIG. 10 and with the separate MOSFET structures provided mutually connected in a vertical configuration.

A reduction of the current path length and a significant simplification of the structure of the AND gate can be achieved by stacking the MOSFET structures vertically as shown in FIG. 12. Again the same reference numbers as in FIGS. 10 and 11 are used. It can be seen that the vertical AND gate structure exploits the fact that the gate electrodes $g_1$ and $g_3$ of the transistors $Q_1$, $Q_3$ are at the same common potential, the gate electrodes $g_2$ and $g_4$ in $Q_2$, $Q_4$ on another common potential and the gate electrodes $g_5$ and $g_5$ in $Q_6$ on a third common potential. Hence the transistors $Q_1$–$Q_6$ are implemented as CMOS circuits in a pairwise back-to-back configuration by common gate electrode $g_1$, $g_3$; $g_2$, $g_4$; $g_5$, $g_6$ for the corresponding MOSFET structures $Q_1$, $Q_3$; $Q_2$, $Q_4$; $Q_5$, $Q_6$. Each CMOS circuit is provided on an isolating layer, which in FIG. 12 is located below $Q_3$, between $Q_1$ and $Q_4$ and between $Q_2$ and $Q_5$ in each of the MOSFET structures.

The gate electrodes g are also, of course, isolated from the active semiconductor material b, not explicitly denoted as isolating layers which comprise the respective gate isolators. The horizontal current paths in FIGS. 10 and 11 are now substantially replaced by vertical current paths which extend through the layers and provide the same connection as shown in the equivalent circuit in FIG. 9. Particularly the current path 15 is shown which also is realized vertically in the configuration in FIG. 10 and as before connects the gate electrodes $g_5$, $g_6$ on $Q_5$, $Q_6$ with the connection between the drain electrodes $d_2$, $d_3$ on $Q_2$, $Q_3$ and the drain electrode $d_1$ on $Q_1$, The vertical AND gate structure in FIG. 12 including the substrate 1 is generated by a total of 24 sublayers, of which 6 relatively thick isolating layers form the gate isolators and three corresponding thick isolating layers isolate the paired combinations of MOSFET structures mutually. With the same dimensions as indicated in connection with the description of FIG. 1, the whole stacked layer configuration in FIG. 12 has a thickness of about 3.0 $\mu$m and can be provided on an area of 16 $\mu m^2$. The total volume thus becomes less than 50 $\mu m^3$, a reduction of the volume of ⅓ relative to the configuration in FIG. 11. However, most important is the reduction in the length of the current paths. In the configuration in FIG. 11 from the indicated dimensions the current paths have a length of 52 $\mu$m. In the configuration in FIG. 12, the current length is about 15 $\mu$m in an optimal embodiment, which implies a reduction of about 70%. Note, FIG. 12 is schematic and the vertical current paths are mutually displaced in the horizontal plane in order to appear more clearly. They may, however, lie in the same plane, parallel to one of the side surfaces of the structure.

Within the scope of today's thin-film technology and using technologies as mentioned above in order to create electrically conducting and/or semiconducting structures in thin films by irradiation of convertible organic materials, it is wholly possible to reduce the linear dimensions in the horizontal direction, such that the component density can be increased by at least one order of magnitude. This implies that the configuration in FIG. 11 may realize about $10^5$ logic gates of the kind shown on 1 mm$^2$ with a layer thickness well below 1 $\mu$m. Additionally, the configuration in FIG. 12 might realize about 6·$10^5$ gates on the same area with a somewhat better form factor, such that the increase in the device density becomes about 33% relative to the device density of the configuration in FIG. 11.

The processing of single layers (i.e., the generating of electrically conducting and/or semiconducting structures) may include possible post-treatments and corrections, e.g., a possible heat treatment before the separate layers are joined into a multilayer structure and form a stacked circuit configuration after the converting by means of electric fields has taken place and when it is performed as shown in FIGS. 2a–f and FIG. 3.

For instance, after the conversion a heat treatment of single layers can be performed to control conducting or semiconducting properties, e.g., conversion of monomer to oligomer or polymer, doping, crystallization, etc. Such processes are well-known and have a wide application. Therefore, specific examples are not provided. For example, the heat treatment may be performed by means of irradiation. Another possibility is to use the electric alternating fields. In principle alternating fields may also be used to effect the field conversion of EFCM. Then, the power supply 23 shown in FIGS. 2a–f is an alternating voltage source. A resistive material, which is subjected to an alternating field, will be heated. By using an alternating voltage field for generating a transition from a non-conducting to a conducting and/or semiconducting state, a heating of the thus generated electrically conducting structure may take place and a possible desired heat treatment may also take place in situ and simultaneously with the conversion process.

For example, by using organic materials in the layers and generating the electrically conducting and/or semiconducting structures with conversion by means of electric fields according to the present invention, a far simpler and less expensive manufacturing of electronic devices is obtained than is possible with today's inorganic semiconductor technology. If a reel-to-reel arrangement is used in the manufacture of circuits as shown in FIG. 3, the production can take place with high volume and high speed and without essential dimensional limitations. With the joining of separate layers into a multilayer structure and forming of a stacked configuration, the registration between the layers will be critical in order to ensure that vertical conducting structures in separate layers register mutually. Electrodes and active semiconductor materials in the semiconductor structures also need to register mutually. The requirement for registration accuracy is given by the pitch that can be realized in the manufacture of the electrically conducting and/or semiconducting structures, but may practically also be realized by using interferometric methods for control and positioning, optically recordable marking, or mechanical or electrical nanotechnology. Such measures, however, fall outside the scope of the present invention and are hence not discussed in greater detail, but must be regarded as known to persons skilled in the art.

By using the method for generation according to the present invention, the protocol for a given circuit configuration in multilayer design can be generated far from the manufacturing location of the circuit. For example, the protocol can be transmitted to the manufacturing location for downloading to a control device that controls the generation of the physical circuit patterns in situ at the manufacturing location. Thus, a user can generate and produce circuits by tele-processing according to the user's own specifications solely by transmitting the necessary instructions and information. Thereby, the present invention furnishes the concept application- and customer-specific circuit production with a radically new content.

What is claimed is:

1. An electric field generator/modulator (EFGM) for patterning and generating electrically conducting and/or semiconducting structures in two or three dimensions in a composite matrix, wherein the matrix comprises one or more materials respectively provided in one or more spatially separate and homogenous material structures, wherein the materials in response to the supplied energy can undergo specific physical and/or chemical changes of state which cause transition from an electrically non-conducting state to an electrically conducting and/or semiconducting state and vice versa, or a change in the electrically conducting ability of the material, wherein each material structure is made in the form of a thin layer, and wherein the electric field generator/modulator comprises:

a first electrode means with a plurality of parallel strip electrodes provided in a first plane;

a second electrode means with a plurality of parallel strip electrodes provided at a distance from the first electrode means and super-positioned thereto in a second plane parallel with the first plane such that the electrodes of the first and second electrode means mutually are substantially orthogonally oriented;

wherein the electrode means are connected with a controllable power supply; and wherein a space between each electrode means is adapted to receive a thin-film material in a form of a discrete component or a continuous tape, which continuously or intermittently is fed through the space without touching the electrode means and with simultaneous positioning and alignment spaced apart from and between each electrode means in a plane substantially parallel thereto, whereby the electrically conducting and/or semiconducting structures are optionally generated according to a determined protocol and are generated by means of point, line and/or area potentials that are created between selected electrodes in the electrode means when the selected electrodes over the cross-connection devices are supplied with electric power.

2. The electric field generator/modulator according to claim 1, wherein the electrodes in each of the first and second electrode means are provided on or in surfaces of respective substrates facing each other.

3. The electric field generator/modulator according to claim 2, wherein the strip electrodes are made as a part of the substrates and form conducting structures in the substrates.

4. The electric field generator/modulator according to claim 1, wherein the distance between the electrode means is controllable depending on a thickness of the thin-film material.

5. The electric field generator/modulator according to claim 1, wherein the electrodes in each electrode means are provided with a mutual distance between 0.1 $\mu$m and 1.0 $\mu$m.

6. The electric field generator/modulator according to claim 1, wherein the electrodes in each electrode means are formed with substantially constant width of 0.1 $\mu$m to 1.0 $\mu$m.

7. An apparatus for generating electrically conducting, semiconducting and/or non-conducting structures in two or three dimensions in a composite matrix, wherein the matrix comprises one or more materials respectively provided in one or more spatially separate and homogenous material structures, wherein the materials in response to the supplied energy can undergo specific physical and/or chemical changes of state which cause transition from an electrically non-conducting state to an electrically conducting and/or semiconducting state and vice versa, or a change in the electrically conducting ability of the material, wherein each material structure is made in the form of a thin layer, and wherein the apparatus comprises:

an electric field generator/modulator comprising:

a first electrode device having a plurality of parallel strip electrodes provided in a first plane;

a second electrode device having a plurality of parallel strip electrodes provided at a distance from the first electrode device and positioned thereto in a second plane parallel with the first plane such that the electrodes of the first and second electrode devices mutually are substantially orthogonally oriented;

a controllable power supply; and cross-connection devices that connect the electrode devices with the controllable power supply, wherein a space between the electrode devices accommodates a thin-film material in a form of a discrete component or a continuous tape, and whereby the electrically conducting, semiconducting and/or non-conducting structures are generated by means of point, line and/or area potentials that are created between selected electrodes in the electrode device when the selected electrodes over the cross-connection devices are supplied with electric power.

8. The apparatus according to claim 7, wherein the electrically conducting, semiconducting and/or non-conducting structures are optionally generated according to a determined protocol.

9. The apparatus according to claim 8, wherein the electric field generator/modulator modulates the electric field in a plane substantially parallel with the thin layer and creates electrical point or line potentials by selective supply of voltage to the electrodes of the first and second electrode devices according to the determined protocol, and generates the electrically conducting, semiconducting, and/or non-conducting structures in response to the electrical point or line potentials.

10. The apparatus according to claim 7, further comprising:

positioning and alignment rolls that feed the thin-film material continuously or intermittently into the space between the first and second electrode devices without touching the electrode devices and wherein the positioning and alignment rolls provide simultaneous positioning and alignment of the thin-film material from and between each electrode device in a plane substantially parallel to each electrode device.

11. The apparatus according to claim 7, further comprising:

laminating rolls that combine two or more layers of the thin-film material in a stacked configuration, such that the composite matrix formed by separate adjacent layers has electrically conducting, semiconducting, and/or non-conducting structures in three dimensions.

12. The apparatus according to claim 11, wherein the stacked configuration is formed by a lamination of two or more self-supporting layers.

13. The apparatus according to claim 7, further comprising:

a plurality of rolls, wherein each separate material layer in tape form is drawn from respective rolls;

alignment rolls that position and apply tension to each material layer tape; and laminating rolls that laminates two or more material layer tapes in a stacked configuration, such that the composite matrix formed by separate adjacent layers is provided with electrically conducting, semiconducting, and/or non-conducting structures in three dimensions.

* * * * *

UNITED STATES PATENT AND TRADEMARK OFFICE
CERTIFICATE OF CORRECTION

PATENT NO. : 6,776,806 B2
DATED : August 17, 2004
INVENTOR(S) : Gudesen et al.

It is certified that error appears in the above-identified patent and that said Letters Patent is hereby corrected as shown below:

<u>Title page,</u>
Item [30], Foreign Application Priority Data, should read as follows:
-- [30]   Foreign Application Priority Data,
       Jan. 28, 1998     (NO)     980385
       June 2, 1998     (NO)     982518 --

Signed and Sealed this

Fifth Day of April, 2005

JON W. DUDAS
*Director of the United States Patent and Trademark Office*